United States Patent
Kumar et al.

(10) Patent No.: US 10,163,515 B1
(45) Date of Patent: Dec. 25, 2018

(54) MEMORY SYSTEM HAVING FEATURE BOOSTING AND OPERATING METHOD THEREOF

(71) Applicant: SK hynix Inc., Gyeonggi-do (KR)

(72) Inventors: Naveen Kumar, San Jose, CA (US); Aman Bhatia, San Jose, CA (US); Chenrong Xiong, San Jose, CA (US); Yu Cai, San Jose, CA (US); Fan Zhang, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/714,566

(22) Filed: Sep. 25, 2017

(51) Int. Cl.
- *G11C 16/06* (2006.01)
- *G11C 16/10* (2006.01)
- *G06F 11/30* (2006.01)
- *G11C 11/4096* (2006.01)
- *G05B 19/045* (2006.01)

(52) U.S. Cl.
CPC .......... *G11C 16/107* (2013.01); *G05B 19/045* (2013.01); *G06F 11/3037* (2013.01); *G11C 11/4096* (2013.01)

(58) Field of Classification Search
CPC .................................................. G06F 11/1048
USPC ..................................................... 365/185.09
See application file for complete search history.

(56) References Cited

U.S. PATENT DOCUMENTS

| | | | |
|---|---|---|---|
| 7,994,974 B2 | 8/2011 | Levy | |
| 9,245,354 B2 | 1/2016 | Yang et al. | |
| 2014/0119113 A1* | 5/2014 | Xia | G11C 16/06 365/185.03 |
| 2016/0170871 A1* | 6/2016 | Hyun | G06F 3/06 711/103 |

\* cited by examiner

*Primary Examiner* — Hoai V Ho
(74) *Attorney, Agent, or Firm* — IP & T Group LLP

(57) ABSTRACT

A semiconductor memory system and an operating method thereof include a plurality of memory devices; and a memory controller including a feature booster and a linear predictor and coupled with the plurality of memory devices, wherein the controller is configured to collect NAND data from at least 1 data point, and model the collected NAND data with a mixture model, wherein the mixture model includes parameters and at least two latent variables modeled with different distribution modeling, the feature booster is configured to predict the parameters, and the linear predictor is configured to predict feature information.

20 Claims, 7 Drawing Sheets

MEMORY SYSTEM HAVING FEATURE BOOSTING AND OPERATING METHOD THEREOF

BACKGROUND

Field of Invention

Exemplary embodiments of the present invention relate to an apparatus of semiconductor memory storage system, and more particularly to error correction code (ECC) in NAND and an operation method thereof.

Description of Related Arts

The computer environment paradigm has shifted to ubiquitous computing systems that can be used anytime and anywhere. Due to this fact, the use of portable electronic devices such as mobile phones, digital cameras, and notebook computers has rapidly increased. These portable electronic devices generally use a memory system having memory devices, that is, a data storage device. The data storage device is used as a main memory device or an auxiliary memory device of the portable electronic devices. Thus, the reliability of digital data storage, such as a memory system, is critical.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

The SSD can include various flash memory components. The two main types of flash memory components are named after the NAND and NOR logic gates. The individual flash memory cells exhibit internal characteristics similar to those of the corresponding gates. The NAND-type flash memory may be written and read in blocks (or pages) which are generally much smaller than the entire device. The NAND-type operates primarily in memory cards, USB flash drives, solid-state drives, and similar products, for general storage and transfer of data.

Electrical or magnetic interference inside the computer system can cause a single bit of memory cells of the memory system to spontaneously flip to the opposite state to cause errors and result in internal data corruption. Bit errors of a memory system can be caused by degradation of internal NAND memory structures from previous repeated accesses. In this case, the NAND is wearing out and not getting high energy particle disturbance. The memory system, or storage devices has an Error Correction Code (ECC) controller that can detect and correct the most common kinds of the internal data corruption. The memory system having the ECC controller is used in most computers where data corruption cannot be tolerated under any circumstances.

Typically, the ECC controller maintains the memory system immune to single-bit errors, the data that is read from each word is always the same as the data that has been written to, even if one or more bits actually stored have been flipped to the wrong state.

Thus, there remains a need for a semiconductor memory system and operating method thereof having an accurate error correction. In view of the ever-increasing need to improve performance and security, it is more and more critical that answers be found to these problems. Solutions to these problems have been long sought but prior developments have not taught or suggested any solutions and, thus, solutions to these problems have long eluded those skilled in the art.

SUMMARY

Embodiments of the present disclosure are directed to a semiconductor memory system and an operating method thereof capable of improving the performance and reliability of a memory system.

In accordance with an embodiment of the present invention, there is provided with a semiconductor memory system which includes a plurality of memory devices; and a memory controller including a feature booster and a linear predictor and coupled with the plurality of memory devices, wherein the controller is configured to collect NAND data from at least 1 data point, and model the collected NAND data with a mixture model, wherein the mixture model includes parameters and at least two latent variables modeled with different distribution modeling, the feature booster is configured to predict the parameters, and the linear predictor is configured to predict feature information.

In accordance with an embodiment of the present invention, there is provided with a method of operating a semiconductor memory system which includes collecting NAND data from at least 1 data point of a plurality of memory devices; and modelling the collected NAND data with a mixture model by a memory controller including a feature booster and a linear predictor and coupled to the plurality of memory devices, wherein the mixture model includes parameters and at least two latent variables modeled with different distribution modeling; predicting the parameters by the feature booster; and predicting feature information by the linear predictor.

DETAILED DESCRIPTION

Figure 1:
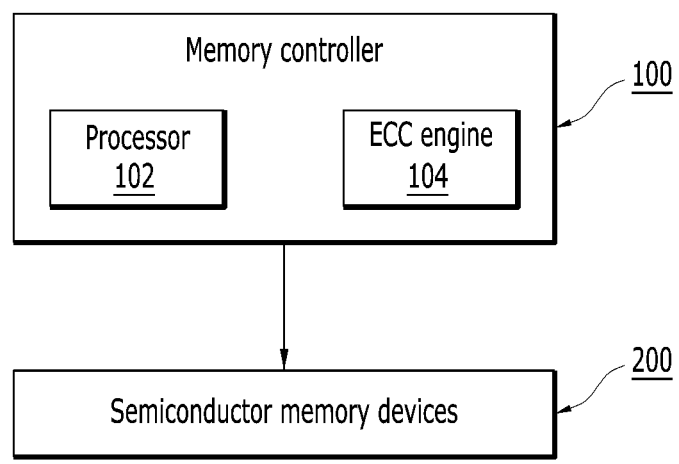
FIG. 1 is a top level block diagram schematically illustrating a semiconductor memory system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A memory system having an error correction code (ECC) for read operation, such as low density parity check (LDPC) decoding, is disclosed. The memory system comprises at least a memory device and a controller. The controller may comprise internal memories configured to store a set of bits during decoding, and an ECC controller. The memory devices, such as NAND, may be coupled with the controller and transfer data thereto following received instructions.

The memory system, such as solid state drive (SSD), can typically operates in a "normal" mode until uncorrectable errors occur during reading of the memory devices with a read command. Once the uncorrectable errors occur, the ECC controller can operate in an "error recovery" mode. In the error recovery mode, several distinct steps can be involved to attempt to correct the errors uncorrectable in the normal mode. The distinct steps can be executed sequentially or concurrently. The subsequent steps are more robust than the previous steps to attempt to correct the errors and supply intended data. During the ECC procedure, the set of bits of NAND data may be successfully corrected, or may be failed to be corrected. The failed bits can be predicted and modeled in accordance with various techniques.

The data stored in NAND may behavior variously across different generations of NAND. The NAND data may not be able to be modeled with a simple model because of the various behaviors of the different generations of NAND.

The failed bits histograms may change significantly with different parameters, such as values of program/erase (PE) cycles, retention, and XSB including least significant bit/most significant bit/central significant bit (LSB/MSB/CSB). Typically, Gaussian mixture modeling (GMM) technique can be available for estimating the failed bits histograms with the provided NAND data. However, the GMM technique is not able to model the failed bits histograms having long "tails". In this invention disclosure, embodiments of the present invention propose a novel apparatus and method to model the failed bits histograms, and further propose to predict model parameters based at least in part on PE cycles and retention GMM and student-t distributions.

The Gaussian mixture model (GMM) is a probabilistic model assuming that all data points are generated from a mixture of a finite number of Gaussian distributions with unknown parameters. The main difficulty in learning GMM from unlabeled data is that usually it is unknown which points come from which latent components. A variety of approaches can be provided to solve the problem, many of which focus on maximum likelihood methods, such as expectation maximization (EM).

The novel apparatus and method to model the failed bit histograms in the embodiments of the present invention can be proposed using the EM algorithm. The expectation maximization (EM) is a statistical algorithm to get around the unknown latent components by an iterative process. Therefore, the EM can still be used for modeling failed bits even with unknown latent components. The EM can be an effective technique used to determine the parameters of a mixture model with a priori given number of components. This is a particular way of implementing maximum likelihood estimation for solving the problem. The EM can be one of particular appeal for finite normal mixtures where closed-form expressions are possible. First, random components are picked. For each point, the probabilities of the point being generated from each component of the model can be computed. In general, mean and variance are sufficient for the Gaussian distribution. However, other parameters may also need to be tweaked in some distributions, such that, the parameters of the model can be tweaked to maximize the likelihood of the data given those correlations. Repeating this process is guaranteed to always converge to a local optimum.

Updating rules of the EM algorithm using various distribution, such as GMM or Student-t distribution can be derived in the embodiments of the present invention, wherein the Student's t-distribution or t distribution, is a probability distribution that is used to estimate population parameters when the sample size is small and/or when the population variance is unknown. GMM can be a specific case of EM where distributions can be assumed to be Gaussian. In probability theory and statistics, the variance is the expectation of the squared deviation of a random variable from its mean, and it informally measures how far a set of random numbers are spread out from their mean. The proposed model with selected GMM or student-t distribution can fit the real NAND data quite well. Furthermore, the apparatus and method to predict the parameters of the model based on the PE cycles and the retention of NAND data is proposed. The dependency of model parameters can be exploited while linear regression being performed.

Referring now to FIG. 1, therein is shown a top-level block diagram schematically illustrating a memory system in accordance with an embodiment of the present invention.

The memory system can include numerous components including a memory controller 100, and semiconductor memory devices 200, such as flash memory devices. The memory controller 100 can comprise a processor 102 for executing programs and instructions stored in the memory system for operating the memory system. The processor 102 may comprise an ECC engine or ECC controller 104. Alternatively, the ECC controller 104 can be located inside the processor 102.

The memory controller 100 may control overall operations of the semiconductor memory devices 200, via a communication input/output (I/O) bus comprises command CMD, address ADDR, data DATA, power PWR, and a control signal CTRL. The control signal CTRL may include a command latch enable (CLE) signal, an address latch enable (ALE) signal, a chip enable (CE) signal, a write enable (WE) signal, a read enable (RE) signal, and so on.

The semiconductor memory devices 200 may perform one or more erase, program, write, and read operations under the control of the memory controller 100. The semiconductor memory devices 200 may receive the command, address, and data through input/output lines from the memory controller 100. The semiconductor memory devices 200 may receive the power PWR through a power line and the control signal CTRL through a control line.

The memory controller 100 and the semiconductor memory devices 200 may be integrated in a single semiconductor device such as the SSD or a memory card. For example, the memory controller 100 and the semiconductor memory devices 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMC micro), a secure digital (SD) card, a mini secure digital (mini SD) card, a micro secure digital (microSD) card, a secure digital high capacity (SDHC), and a universal flash storage (UFS).

For another example, the memory system may be provided as one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

Figure 2:
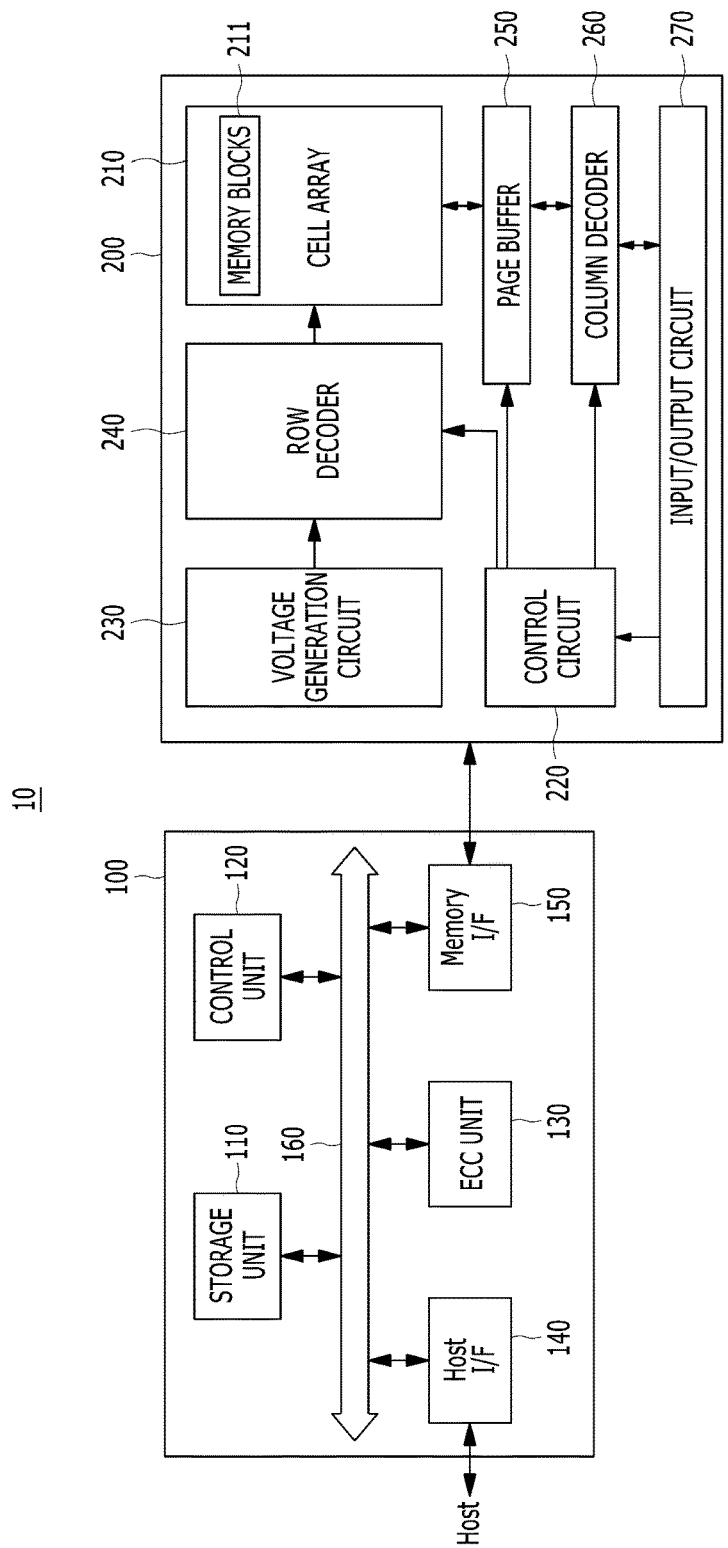
FIG. 2 is a detailed block diagram illustrating a semiconductor memory system in accordance with an embodiment of the present invention.

Referring now to FIG. 2, therein is shown a detailed block diagram illustrating a memory system in accordance with an embodiment of the present invention. For example, the memory system of FIG. 2 may depict the memory system shown in FIG. 1. The memory system may include the memory controller 100 and the semiconductor memory devices 200. The memory system may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, a digital video recorder and a digital video player. In some embodiments, the host device may include a portable electronic device such as a mobile phone, a smart phone, an e-book, an MP3 player, a portable multimedia player (PMP), and a portable game player.

The semiconductor memory devices 200 may store data to be accessed by the host device.

The semiconductor memory devices 200 may be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The memory controller 100 may control storage of data in the semiconductor memory devices 200. For example, the memory controller 100 may control the semiconductor memory devices 200 in response to a request from the host device. The memory controller 100 may provide the data read from the semiconductor memory devices 200, to the host device, and store the data provided from the host device into the semiconductor memory devices 200.

The memory controller 100 may include a storage unit 110, a control unit 120, the error correction code (ECC) unit 130, a host interface 140 and a memory interface 150, which are coupled through a bus 160.

The storage unit 110 may serve as a working memory of the memory system and the memory controller 100, and store data for driving the memory system and the memory controller 100. When the memory controller 100 controls operations of the semiconductor memory devices 200, the storage unit 110 may store data used by the memory controller 100 and the semiconductor memory devices 200 for such operations as read, write, program and erase operations.

The storage unit 110 may be implemented with a volatile memory. The storage unit 110 may be implemented with a static random access memory (SRAM) or a dynamic random access memory (DRAM). As described above, the storage unit 110 may store data used by the host device in the semiconductor memory devices 200 for the read and write operations. To store the data, the storage unit 110 may include a program memory, a data memory, a write buffer, a read buffer, a map buffer, and so forth.

The control unit 120 may control general operations of the memory system, and a write operation or a read operation for the semiconductor memory devices 200, in response to a write request or a read request from the host device. The control unit 120 may drive firmware, which is referred to as a flash translation layer (FTL), to control the general operations of the memory system. For example, the FTL may perform operations such as logical to physical (L2P) mapping, wear leveling, garbage collection, and bad block handling. The L2P mapping is known as logical block addressing (LBA).

The ECC unit 130 may detect and correct errors in the data read from the semiconductor memory devices 200 during the read operation. The ECC unit 130 may not correct error bits when the number of the error bits is greater than or equal to a threshold number of correctable error bits, and may output an error correction fail signal indicating failure in correcting the error bits.

In some embodiments, the ECC unit 130 may perform an error correction operation based on a coded modulation such as a low-density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 130 may include all circuits, systems or devices for the error correction operation.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the memory controller 100 and the semiconductor memory devices 200 to allow the memory controller 100 to control the semiconductor memory devices 200 in response to a request from the host device. The memory interface 150 may generate control signals for the semiconductor memory devices 200 and process data under the control of the CPU 120. When the semiconductor memory devices 200 is a flash memory such as a NAND flash memory, the memory interface 150 may generate control signals for the memory and process data under the control of the CPU 120.

The semiconductor memory devices 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The voltage generation circuit 230, the row decoder 240, the page buffer 250, the column decoder 260 and the input/output circuit 270 form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 is connected to the memory cell array 210 through bit lines BL (not shown). The page buffer 250 may pre-charge the bit lines BL with a positive voltage, transmit/receive data to/from a selected memory block in program and read operations, or temporarily store transmitted data, in response to a page buffer control signal generated by the control circuit 220.

The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

Figure 3:
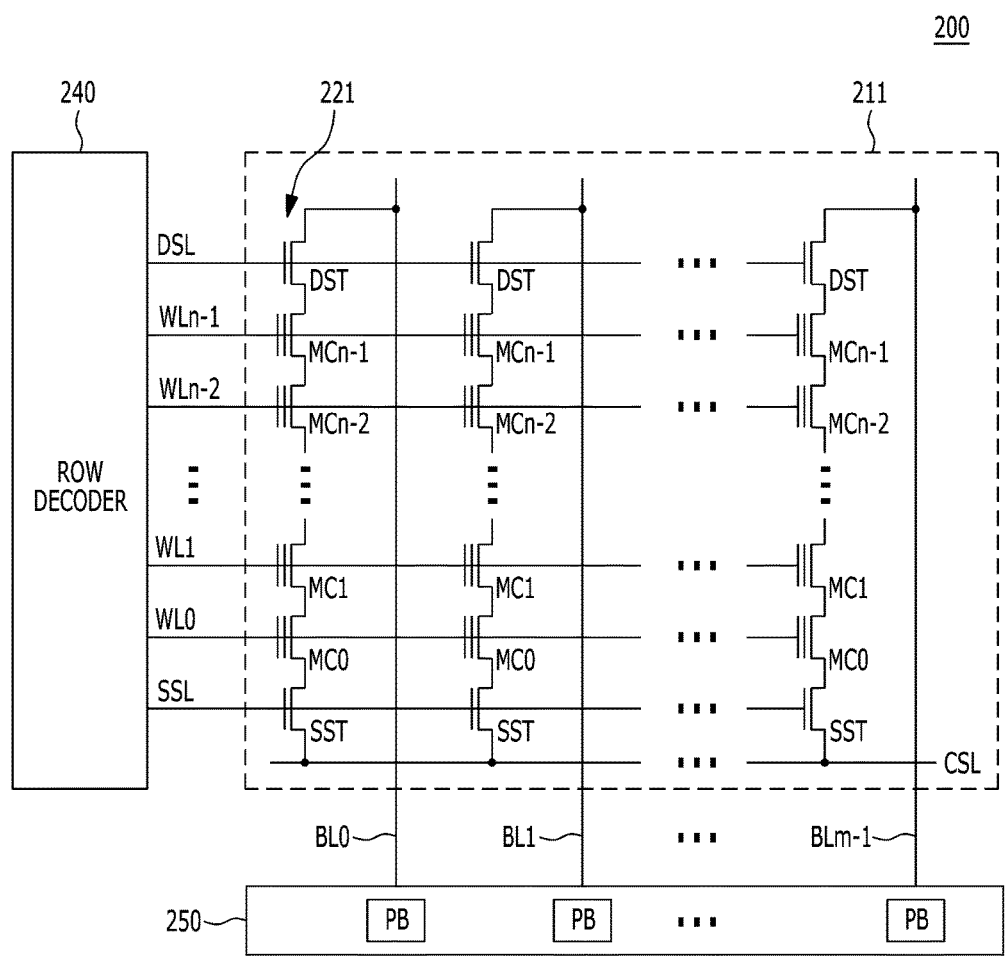
FIG. 3 is a circuit diagram illustrating a memory block of semiconductor memory devices in accordance with an embodiment of the present invention.

Referring now to FIG. 3, herein is shown a circuit diagram illustrating a memory block of semiconductor memory devices 200 in accordance with an embodiment of the present invention. For example, a memory block of FIG. 3 may be the memory blocks 211 of the memory cell array of the semiconductor memory devices 200 shown in FIG. 2.

The memory blocks 211 may include a plurality of cell strings 221 coupled to bit lines BL0 to BLm−1, respectively. The cell string of each column may include one or more drain selection transistors (DST) and one or more source selection transistors (SST). A plurality of memory cells or memory cell transistors may be serially coupled between the DSTs and SSTs. Each of the memory cells MC0 to MCn−1 may be formed of a multi-level cell (MLC) storing data information of multiple bits in each cell. The cell strings 221 may be electrically coupled to the corresponding bit lines BL0 to BLm−1, respectively.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined, and one-NAND flash memory in which a controller is embedded inside a memory chip.

Figure 4:
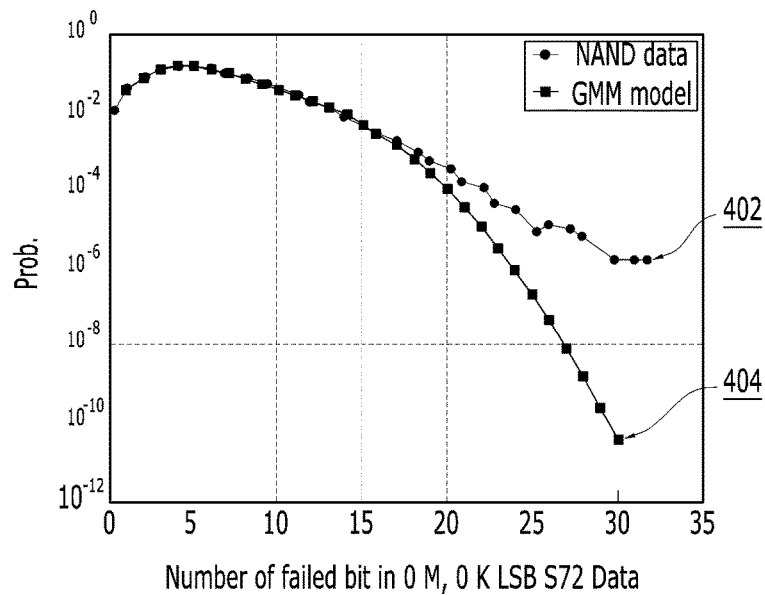
FIG. 4 is a diagram illustrating a failed bits histogram with GMM model of a memory system in accordance with an embodiment of the present invention.

FIG. 4 is a diagram illustrating a failed bits histogram with GMM model of a memory system in accordance with an embodiment of the present invention. The failed bits histogram can comprise a plot of real NAND data 402, and a plot of GMM modeling 404.

The expectation maximization (EM) algorithm is quite popular in unsupervised learning algorithms. The unsupervised learning algorithm is capable of learning parameters of latent variables that are not observed. The GMM can be a special case of EM algorithm, wherein the latent variables are assumed to be Gaussian distributed. The GMM is quite simple yet powerful technique to learn parameters of the model. The EM algorithms can use other models for the latent variables distribution as well.

The parameters update rules in iterations can be derived in closed form in the case of GMM. While analyzing the NAND data, the GMM model can be used in initial attempt for fitting the NAND data, as shown in FIG. 4. Obviously, the GMM model, or any distribution modeling having tail, is not capable to capture the "tail" observed in the NAND data. As shown in FIG. 4, the plot of real NAND data 402 and the plot of GMM modeling 404 are matching very well in the head section, where numbers of the failed bits are small. However, the plot of real NAND data 402 and the plot of GMM modeling 404 are farther segregated from each other at the tail section, where the numbers of the failed bits are larger. FIG. 4 is one example of the plot of the failed bits histogram with GMM model when the retention of NAND data is 0 month (M) and the number of the PE cycles is 0 kilo (K).

It has been discovered that, the GMM modeling can be utilized for fitting the failed bits of the NAND data quite well with less errors or less failed bits. However, the GMM modeling may not be able for more errors or failed bits. Thus, a mixture model comprises multiple models may be introduced, wherein the multiple models can comprise a model fitting well with less failed bits, such as the GMM, and other models fitting well with more failed bits.

Figure 5:
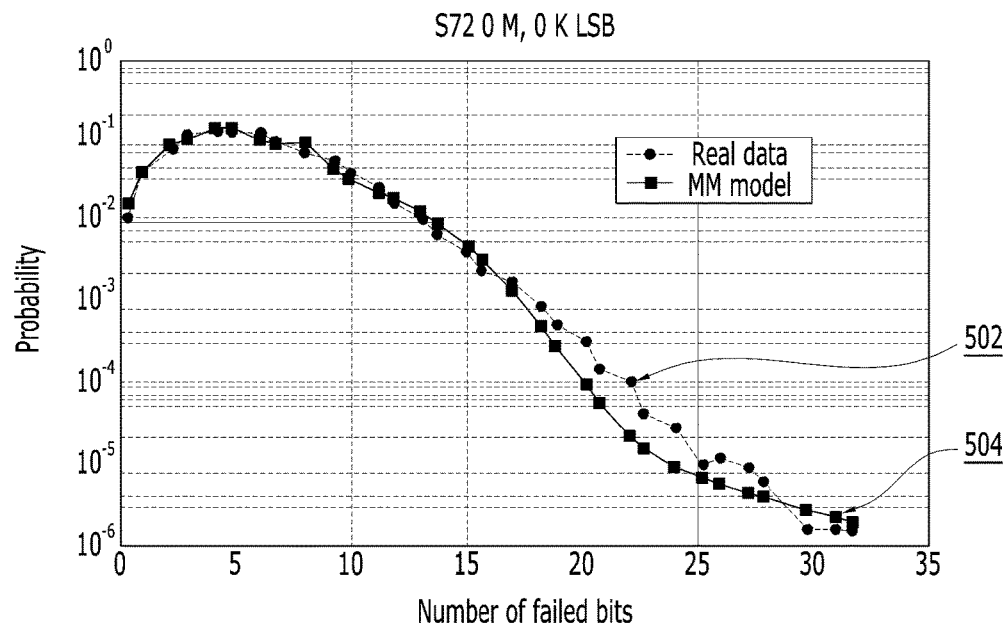
FIG. 5 is a diagram illustrating a failed bits histogram with a proposed mixture model of a memory system in accordance with an embodiment of the present invention.

FIG. 5 is a diagram illustrating a failed bits histogram with a proposed mixture model of a memory system in accordance with an embodiment of the present invention. The proposed mixture model (MM) in the embodiments of the present invention can allow at least one latent variable to be a student-t distribution and at least one latent variable to be Gaussian distribution. Student-t distribution is simple enough for modeling and capturing tail information quite well. The parameters update rule for student-t distribution can also be derived in closed form like the GMM case. As shown in FIG. 5, a plot of real NAND data 502 and a plot of MM modeling 504 with at least one latent variable to be a student-t distribution and at least one latent variable to be Gaussian distributed, are fit not only the head section but also the tail section quite well. In other words, the proposed MM model can fit the NAND data very well with less failed bits and more failed bits.

It has been discovered that, the MM modelling with at least one latent variable to be a student-t distribution and at least one latent variable to be Gaussian distribution can fit the NAND data quite well, regardless of the numbers of failed bits. The MM modelling comprising multiple models can be utilized in predication of failed bits more accurately than using a single model, for solving the problem of NAND behavior variation.

Figure 6:
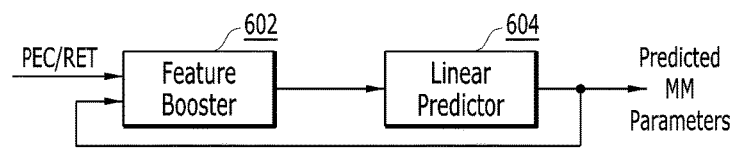
FIG. 6 is a block diagram schematically illustrating architecture of a proposed mixture model of a memory system in accordance with an embodiment of the present invention.

FIG. 6 is a block diagram schematically illustrating architecture of a proposed mixture model of a memory system in accordance with an embodiment of the present invention. The architecture can comprise a feature booster 602 and a linear predictor 604. It is important to note that feature booster 602 can select appropriate features that can be useful in predicting other parameters of the model, such as variances.

The parameters of MM can be predicted in accordance with the given feature information, such as PE cycles and retention. The number of the parameters can be various, such as at least six, can be estimated from the NAND data running EM algorithm in the embodiments of the current invention. The key challenges in the prediction problem are that there is not much feature information or NAND data available for training with the feature information. Noticeably, the said prediction problem may not be solved by running a simple regular linear regression. The novel technique proposed in the embodiments of the present invention, the dependency of latent variables can be exploited in the prediction. The mixture model parameters for Gaussian and student-t distributions can comprise weights, means, and variances for the latent variables. The feature booster 602 can be configured to perform variance prediction by feature boosting.

First, the weights of latent variables from the NAND data using linear regression on the given feature information can be predicted by the linear predictor 604. Inputs to the linear predictor 604 can include various parameters, such as the PE cycles and retention, in accordance with the data. In general, depending upon the condition when the data is collected, the inputs can include anything related with the data. For example, the read disturb can also be input. Outputs of the model at first stage can be parameters of a first latent variable which is dominant in distribution. Then, the parameters can be used at second stage by increasing the dimensionality of the features. Obviously, since the weights don not affect the means and variances of the latent variables, the means of the latent variables can be predicted concurrently too. The predicted means information and the weights information, can be fed back to and used as new feature information for variance prediction by the feature booster 602.

The feature booster 602 can predict parameters of the MM, such as the variances information, quite well with the new feature information from the linear predictor 604, inputs of the PE cycles (PEC), the retention (RET), or a combination thereof.

The predicted parameters of MM can be fed back as new feature information for a subsequent iteration, or output as the MM parameters when the prediction iterations are completed, such that the number of iterations equals the number of distributions fitting to the data. As discussed above, the feature booster 602 can select appropriate feature information in the predication computation, in accordance with the memory system configurations, the current iteration feature information, and/or other factors.

Following equations can explain the feature boosting and inputs/outputs at each stage.

Assume that 4 data points are given and the NAND data A is collected at the 4 data points, $$A=[PEC\_0RET\_0;PEC\_1RET\_1;PEC\_2RET\_2;PEC\_3RET\_3]$$

where PEC_n is the PE cycle of point n, RET_n is the retention of the point n, n is the index number of the 4 data points, The optimal parameters can be estimated by the proposed channel model as $$B=[P\_0;P\_1;P\_2;P\_3]$$

where each P_n consists of the 6 parameters discussed above, the dimension of A is (4×2), and the dimension of B is (4×6).

During the first stage prediction, the linear prediction (LP) is:

$$\widehat{\{X1\}}=\mathrm{argmin}\_\{X1\}|AX1-B(:,1:2)|^2 \qquad \text{(MMSE problem)}$$

where, X1 is the feature information at the first stage prediction, the dimension of X1 is (2×2).

During the second stage prediction, the linear prediction (LP) is:

$$\widehat{\{X2\}}=\mathrm{argmin}\_\{X2\}|[AB(:,1:2)]X2-B(:,3:4)|^2 \quad \text{(MMSE problem)}$$

where, X2 is the feature information at the second stage prediction, the dimension of X2 is (4×2).

During the third stage prediction, the linear prediction (LP) is:

$$\widehat{\{X3\}}=\mathrm{argmin}\_\{X3\}|[AB(:,1:4)]X3-B(:,5:6)|^2 \quad \text{(MMSE problem)}$$

where, X3 is the feature information at the third stage prediction, the dimension of X3 is (6×2).

As shown in the above states of prediction, dimensionality of features can be increasing at each prediction step. This procedure is called feature boosting. At the first stage, the parameters of the first Gaussian parameters where all mass of histogram lies can be estimated, so there is less error in this prediction. Then the estimated parameters are used for the future stages prediction. And at each stage, two parameters of the distribution are estimated.

Figure 7:
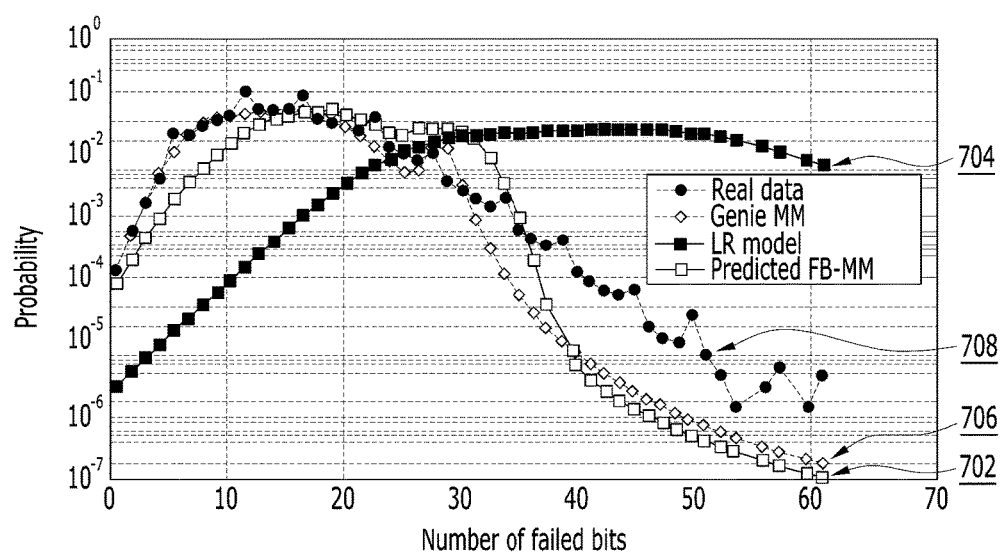
FIG. 7 is a diagram illustrating failed bits histograms in a memory system in accordance with an embodiment of the present invention.

FIG. 7 is a diagram illustrating failed bits histograms in a memory system in accordance with an embodiment of the present invention. FIG. 7 shows a plot of feature boosting prediction 702, a plot of linear regression (LR) prediction 704, a plot of Genie MM prediction 706, and a plot of real data 708.

The feature boosting prediction 702 shown in FIG. 7 is calculated with the feature boosting mixture model (FB-MM) proposed in the embodiments of the present invention. The linear regression (LR) prediction 704 is calculated with the linear regression model, and can be based on only variables of PE cycles and retention. The Genie MM prediction 706 can be calculated with general mixture model or genie mixture model.

As shown in FIG. 7, the feature boosting prediction 702 or the Genie MM prediction 706 can fit with the real data 708 much better than the LR prediction 704. Noticeably, the feature booster 602 of FIG. 6 can select appropriate features useful in predicting other parameters of the model, wherein the features can comprise the PE cycles, the retention, the weights, the means, or the variances of the model. The technique with the feature boosting mixture model proposed in the embodiments of the present invention can judiciously select and use the feature information to predict better parameters. The architecture for plotting the feature boosting prediction 702 can be shown as in FIG. 6.

As shown in FIG. 7, the mixture modeling, such as the genie MM prediction 706 and the feature boosting prediction 702, can fit very well with the real data 708, in both the head section and the tail section. The single modeling, such as the linear regression prediction 704, does not fit the real data 708 very well.

It has been discovered that the embodiments of the present invention provide an apparatus and an operating method thereof for accurately predicting the failed bits histograms and parameters of mixture model, such as the feature boosting mixture model (FB-MM). The apparatus implemented with the FB-MM can be utilized in ECC controller for predicting the failed bits of ECC procedure. The prediction of failed bits with the FB-MM can be more accurately fitting to the real data and can be utilized for training with the feature information, when not much feature information or not much data is available for the training. Thus, the training can be performed even when the feature information or data is not sufficiently, the training result can be more accurate, and the number of the iteration of the training can be reduced.

This invention disclosure provides a novel way to model tails observed in failed bits distribution of NAND data. Proposed model can provide an accurate system level requirement and can be used for SoC verification. Furthermore, predict failed bit histograms can provide better end of life condition. The mixture model, such as FB-MM, can be proposed for modeling failed bits distribution for the NAND data. Furthermore, the proposed model can be utilized for parameters prediction technique where parameters are predicted using feature boosting by allowing usage of available parameters information in iterations.

Figure 8:
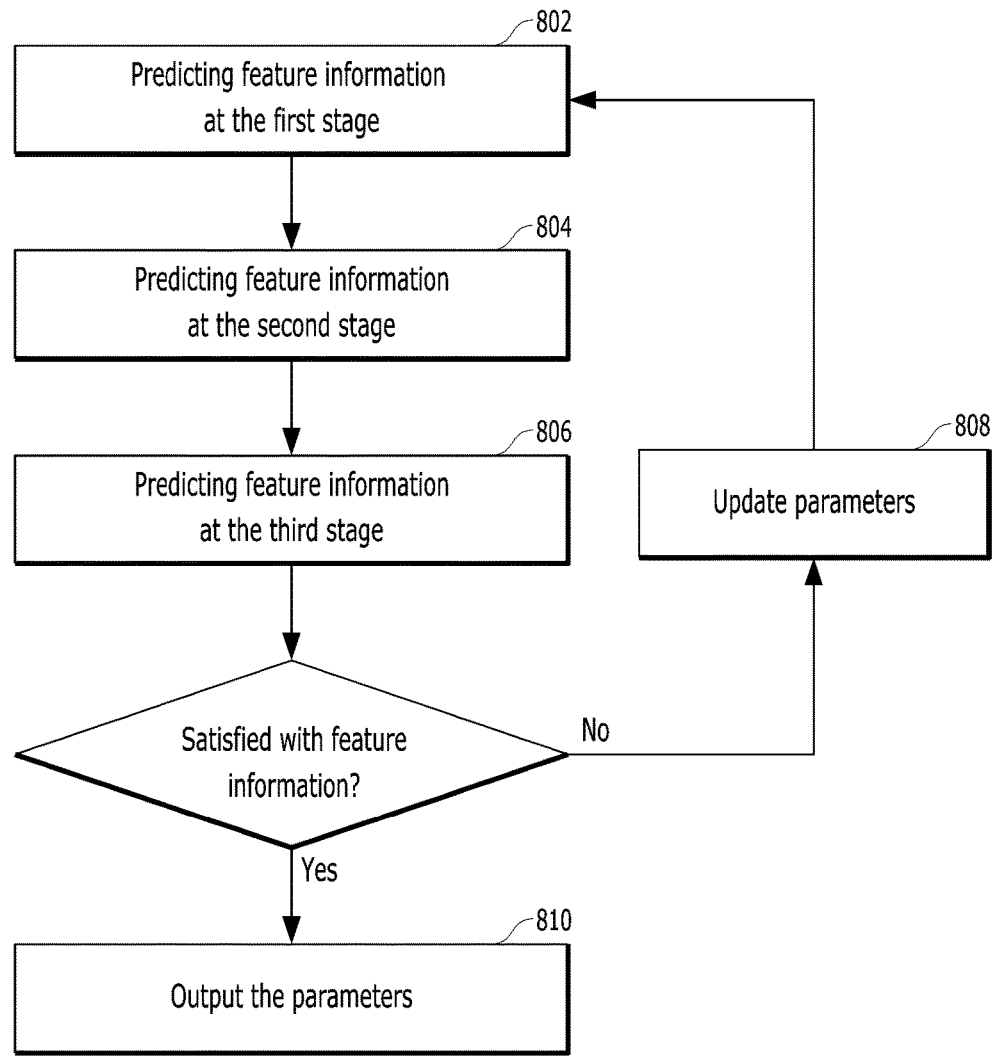
FIG. 8 is a flowchart illustrating feature information prediction of a semiconductor memory system in an embodiment of the present invention.

FIG. 8 is a flowchart illustrating feature information prediction of a semiconductor memory system in an embodiment of the present invention. The flowchart of feature information prediction can include a step 802 of predicting the feature information at the first stage, a step 804 of predicting the feature information at the second stage, and a step 806 of predicting the feature information at the third stage.

Details of predicting the feature information at the first, second, and third stage are described above in FIG. 6. At each stage, the feature information can be predicted with the NAND data, the parameters of a previous iteration, PEC, and RET.

After the last stage of the feature information prediction, such as the third stage, if the result is satisfied, the parameters and feature information can be output at step 810, the prediction procedure can be completed. If the result is not satisfied, the prediction procedure can be repeated in a subsequent iteration, and the parameters of the current iteration can be used in the next prediction iteration in a step 808.

As an example, the embodiment of the present invention shows 3 stages of the feature information prediction. The number of stages of the feature information prediction can be various in accordance with the configuration of the memory system, the number of NAND data collected and used in the prediction, the number of the parameters, etc.

Figure 9:
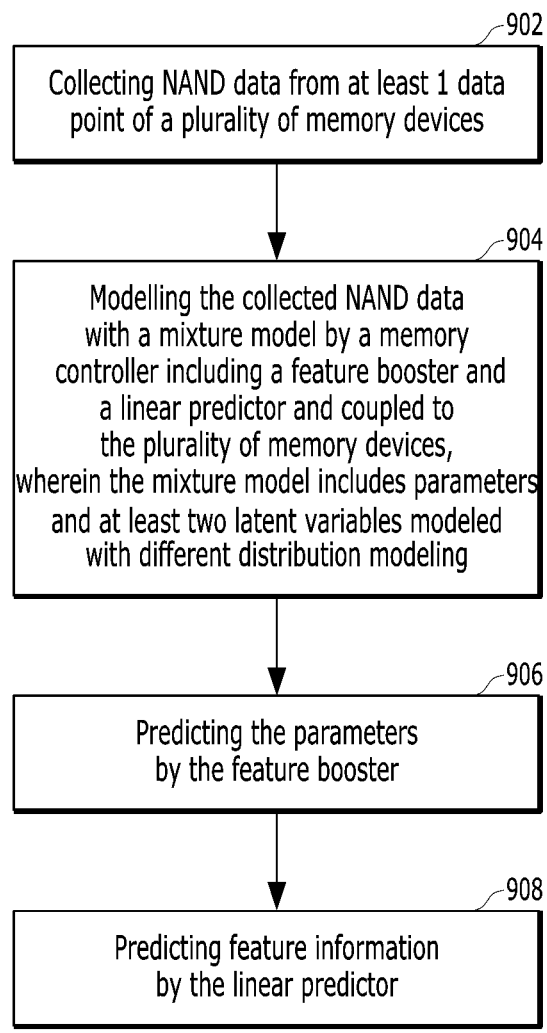
FIG. 9 is a flowchart illustrating an operating method of a semiconductor memory system in a further embodiment of the present invention.

FIG. 9 is a flowchart illustrating an operating method of a semiconductor memory system in a further embodiment of the present invention. The flowchart of operating method of a semiconductor memory system comprising: collecting NAND data from at least 1 data point of a plurality of memory devices in a block of 902; and modelling the collected NAND data with a mixture model by a memory controller including a feature booster and a linear predictor and coupled to the plurality of memory devices, wherein the mixture model includes parameters and at least two latent variables modeled with different distribution modeling in a block of 904; predicting the parameters by the feature booster in a block of 906; and predicting feature information by the linear predictor in a block of 908.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A semiconductor memory system comprising:
   a plurality of memory devices; and
   a memory controller including a feature booster and a linear predictor and coupled with the plurality of memory devices, wherein
   the controller is configured to collect NAND data, and model the collected NAND data with a mixture model, wherein the mixture model includes parameters and at least two latent variables modeled with different distribution modeling,
   the feature booster is configured to predict at least one of the parameters based on initial feature information,
   the linear predictor is configured to predict feature information for the at least one of the parameters, and
   the feature booster is configured to predict at least one other of the parameters based on the feature information for the at least one of the parameters.

2. The system recited in claim 1 wherein the mixture model has one of the at least two latent variables modeled with Gaussian mixture modeling (GMM).

3. The system recited in claim 1 wherein the mixture model has one of the at least two latent variables modeled with Student-t distribution.

4. The system recited in claim 1 wherein the controller is further configured to model the collected NAND data with mixture model for a numerous iterations.

5. The system recited in claim 1 wherein the feature booster is further configured to select particular feature information to predict a select one of the parameters.

6. The system recited in claim 1 wherein the initial feature information comprises PE cycles (PEC), input of retention (RET), or a combination thereof.

7. The system recited in claim 1 wherein the feature booster is further configured to predict the parameters in respective iterations.

8. The system recited in claim 1 wherein the linear predictor is further configured to predict at least weights and means, as feature information, of the at least two latent variables concurrently.

9. The system recited in claim 5 wherein the feature information is generated following numerous stages during a single iteration.

10. The system recited in claim 9 wherein the feature information has a dimensionality increment at each subsequent stage.

11. A method of operating a semiconductor memory system comprising:
    collecting NAND data of a plurality of memory devices;
    modelling the collected NAND data with a mixture model by a memory controller including a feature booster and a linear predictor and coupled to the plurality of memory devices, wherein the mixture model includes parameters and at least two latent variables modeled with different distribution modeling;
    predicting at least one of the parameters based on initial feature information, using the feature booster;
    predicting feature information for the at least one of the parameters, using the linear predictor; and
    predicting at least one other of the parameters based on the feature information for the at least one of the parameters.

12. The method recited in claim 11 wherein the modelling the collected NAND data with a mixture model includes modelling the collected NAND data with at least one of the at least two latent variables modeled with Gaussian mixture modeling (GMM).

13. The method recited in claim 11 wherein the modelling the collected NAND data with a mixture model includes modelling the collected NAND data with at least one of the at least two latent variables modeled with Student-t distribution.

14. The method recited in claim 11 wherein the modelling the collected NAND data with a mixture model includes modelling the collected NAND data for a numerous iterations.

15. The method recited in claim 11 further comprising selecting particular feature information to predict a select one of the parameters, using the feature booster.

16. The method recited in claim 11 wherein the initial feature information comprises PE cycles (PEC), input of retention (RET), or a combination thereof.

17. The method recited in claim 11 further comprising predicting the parameters in respective iterations.

18. The method recited in claim 11 further comprising predicting at least weights and means, as feature information, of the at least two latent variables concurrently.

19. The method recited in claim 15 further comprising generating the feature information following numerous stages during a single iteration.

20. The method recited in claim 19 wherein the generating the feature information includes generating the feature information having a dimensionality increment at each subsequent stage.

* * * * *